(12) United States Patent
Kishimoto et al.

(10) Patent No.: US 8,723,400 B2
(45) Date of Patent: May 13, 2014

(54) PIEZOELECTRIC RESONATOR DEVICE AND MANUFACTURING METHOD THEREFOR

(75) Inventors: Koichi Kishimoto, Kakogawa (JP); Tadataka Koga, Kakogawa (JP); Tatsuya Murakami, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 9 days.

(21) Appl. No.: 13/379,709

(22) PCT Filed: Jan. 28, 2011

(86) PCT No.: PCT/JP2011/051769
§ 371 (c)(1),
(2), (4) Date: Dec. 21, 2011

(87) PCT Pub. No.: WO2011/093456
PCT Pub. Date: Aug. 4, 2011

(65) Prior Publication Data
US 2012/0280597 A1    Nov. 8, 2012

(30) Foreign Application Priority Data
Jan. 29, 2010  (JP) .................................. 2010-018751

(51) Int. Cl.
H01L 41/053    (2006.01)
(52) U.S. Cl.
USPC ........................................................ 310/344
(58) Field of Classification Search
USPC ........................................................ 310/344
See application file for complete search history.

(56) References Cited

U.S. PATENT DOCUMENTS

| | | | | |
|---|---|---|---|---|
| 4,362,961 A | * | 12/1982 | Gerber ........................... | 310/370 |
| 5,585,687 A | * | 12/1996 | Wakabayashi et al. ....... | 310/366 |
| 7,582,969 B2 | * | 9/2009 | Carlson et al. ................ | 257/758 |
| 2010/0270891 A1 | * | 10/2010 | Kohda et al. .................. | 310/344 |
| 2011/0163637 A1 | * | 7/2011 | Hashi ............................. | 310/344 |
| 2011/0215678 A1 | * | 9/2011 | Kohda et al. .................. | 310/344 |

FOREIGN PATENT DOCUMENTS

| | | | | |
|---|---|---|---|---|
| JP | 2002-359312 A | | 12/2002 | |
| JP | 2006-108162 A | | 4/2006 | |
| JP | 2007-243681 | * | 9/2006 | ............... H03H 9/02 |
| JP | 4245924 B2 | | 1/2009 | |
| JP | 2009-71655 A | * | 4/2009 | ............... H03H 9/02 |
| JP | 2009-135826 A | * | 6/2009 | ............... H03H 3/02 |
| JP | 2009-202261 A | | 9/2009 | |
| JP | 2009-260845 A | | 11/2009 | |
| WO | WO 02/078085 A1 | | 10/2002 | |

* cited by examiner

*Primary Examiner* — Thomas Dougherty
(74) *Attorney, Agent, or Firm* — Marvin A. Motsenbocker; Mots Law, PLLC

(57) ABSTRACT

A piezoelectric resonator device in which excitation electrodes of a piezoelectric resonator plate are hermetically sealed, includes a plurality of sealing members that hermetically seal the excitation electrodes of the piezoelectric resonator plate. The plurality of sealing members each have a bonding layer, and at least one of the plurality of sealing members is provided with a bank portion and having the bonding layer formed on a top face of the bank portion. The plurality of sealing members are bonded together with the bonding layers of the sealing members, and a bonding material that contains an intermetallic compound is formed.

19 Claims, 9 Drawing Sheets ns of sealing members that hermetically seal the excitation electrodes of the piezoelectric resonator plate are provided, the plurality of sealing members each have a bonding layer, and at least one of the plurality of sealing members is provided with a bank portion and having the bonding layer formed on a top face of the bank portion. The plurality of sealing members are bonded together with the bonding layers of the sealing members, and a bonding material that contains an intermetallic compound is formed. Accordingly, the bonding of the plurality of sealing members is achieved with the bonding material that contains the intermetallic compound having a higher melt temperature than solder. As a result, it is possible to resist melt temperatures during reflow soldering without the intermetallic compound melting even during reflow soldering, and to enable the intermetallic compound to maintain the hermetic sealing of the excitation electrodes of the piezoelectric resonator plate by the plurality of sealing members.

PIEZOELECTRIC RESONATOR DEVICE AND MANUFACTURING METHOD THEREFOR

TECHNICAL FIELD

The present invention relates to a piezoelectric resonator device and a manufacturing method therefor.

BACKGROUND ART

A piezoelectric resonator device such as a crystal resonator, a crystal filter, or a crystal oscillator is an electronic device in which excitation electrodes of a piezoelectric resonator plate are hermetically sealed. This type of piezoelectric resonator device is constituted by a base made of ceramic material and a lid made of metal material, and a housing of the piezoelectric resonator device makes up a rectangular parallelepiped package. In the internal space of the package, the piezoelectric resonator plate is bonded to the base with a conductive adhesive made of flowable material. With this piezoelectric resonator device, solder is used as a bonding material in bonding the base and the lid. The base and the lid are bonded to each other with solder, and the piezoelectric resonator plate inside the internal space of the package is hermetically sealed (see Patent Document 1, for example).

PRIOR ART DOCUMENT

Patent Document

[Patent Document 1] JP 2002-359312A

SUMMARY OF INVENTION

Problem to be Solved by the Invention

With the piezoelectric resonator device as disclosed in Patent Document 1, as mentioned above, the base and the lid are bonded to each other with solder. Accordingly, there are cases where the solder may melt and flow into the internal space of the package or outside the package during reflow soldering required in placing the piezoelectric resonator device on a printed circuit board or the like. In this case, it is impossible to hermetically seal the piezoelectric resonator plate inside the internal space of the package.

Thus, in order to solve the above problem, it is an object of the present invention to provide a piezoelectric resonator device including a bonding material capable of resisting melt temperatures during reflow soldering, and a manufacturing method for such a piezoelectric resonator device.

Means for Solving the Problems

In order to attain the above object, a piezoelectric resonator device according to the present invention is a piezoelectric resonator device in which excitation electrodes of a piezoelectric resonator plate are hermetically sealed, including a plurality of sealing members that hermetically seal the excitation electrodes of the piezoelectric resonator plate, the plurality of sealing members each having a bonding layer, and at least one of the plurality of sealing members being provided with a bank portion and having the bonding layer formed on a top face of the bank portion, wherein the plurality of sealing members are bonded together with the bonding layers of the sealing members, and a bonding material that contains an intermetallic compound is formed.

According to the present invention, the plurality of sealing members that hermetically seal the excitation electrodes of the piezoelectric resonator plate are provided, the plurality of sealing members each have a bonding layer, and at least one of the plurality of sealing members is provided with a bank portion and having the bonding layer formed on a top face of the bank portion. The plurality of sealing members are bonded together with the bonding layers of the sealing members, and a bonding material that contains an intermetallic compound is formed. Accordingly, the bonding of the plurality of sealing members is achieved with the bonding material that contains the intermetallic compound having a higher melt temperature than solder. As a result, it is possible to resist melt temperatures during reflow soldering without the intermetallic compound melting even during reflow soldering, and to enable the intermetallic compound to maintain the hermetic sealing of the excitation electrodes of the piezoelectric resonator plate by the plurality of sealing members.

In order to attain the above object, another piezoelectric resonator device according to the present invention is a piezoelectric resonator device in which excitation electrodes of a piezoelectric resonator plate are hermetically sealed, including a plurality of sealing members that hermetically seal the excitation electrodes of the piezoelectric resonator plate, the piezoelectric resonator plate and the plurality of sealing members each having a bonding layer, and at least one of the piezoelectric resonator plate and the plurality of sealing members being provided with a bank portion and having the bonding layer formed on a top face of the bank portion, wherein the piezoelectric resonator plate and the plurality of sealing members are bonded to one another with the bonding layers of the piezoelectric resonator plate and the sealing members, and a bonding material that contains an intermetallic compound is formed.

According to the present invention, the plurality of sealing members that hermetically seal the excitation electrodes of the piezoelectric resonator plate are provided, the piezoelectric resonator plate and the plurality of sealing members each have a bonding layer, and at least one of the piezoelectric resonator plate and the plurality of sealing members is provided with a bank portion and having the bonding layer formed on a top face of the bank portion. The piezoelectric resonator plate and the plurality of sealing members are bonded to one another with the bonding layers of the piezoelectric resonator plate and the sealing members, and a bonding material that contains an intermetallic compound is formed. Accordingly, the bonding of the piezoelectric resonator plate and the plurality of sealing members is achieved with the bonding material that contains the intermetallic compound having a higher melt temperature then solder. As a result, it is possible to resist melt temperatures during reflow soldering without the intermetallic compound melting even during reflow soldering, and to enable the intermetallic compound to maintain the hermetic sealing of the excitation electrodes of the piezoelectric resonator plate by the plurality of sealing members.

With the above configuration, at least one of the bonding layers, at least one of bonding parts of the sealing members where the bonding layers are formed, or a bonding part of the piezoelectric resonator plate where the bonding layer is formed may have a raised shape.

In this case, since at least one of the bonding layers, at least one of the bonding parts of the sealing members where the bonding layers are formed, or the bonding part of the piezoelectric resonator plate where the bonding layer is formed has a raised shape, the distance between a top of the raised shape and the sealing members or the piezoelectric resonator plate to be bonded that faces the top of the raised shape becomes the shortest. As a result, it is possible, at the time of bonding, to concentrate the intermetallic compound around the top of the raised shape.

With the above configuration, at least one of bonding parts of the sealing members where the bonding layers are formed or a bonding part of the piezoelectric resonator plate where the bonding layer is formed may have a raised shape, and the at least one of the bonding parts of the sealing members or the bonding part of the piezoelectric resonator plate that has a raised shape may be made of the same material as that of the corresponding one of a group of the sealing members and the piezoelectric resonator plate.

In this case, since at least one of the bonding parts of the sealing members where the bonding layers are formed or the bonding part of the piezoelectric resonator plate where the bonding layer is formed has a raised shape, and the at least one of the bonding parts of the sealing members or the bonding part of the piezoelectric resonator plate that has a raised shape is made of the same material as that of the corresponding at least one of the sealing members and the piezoelectric resonator plate, there are no differences found in the thermal expansion coefficient and it is unlikely that unnecessary stress will occur in the bonding parts at the time of heat bonding. As a result, it is possible to improve the reliability of the hermetic sealing.

With the above configuration, at least one of the piezoelectric vibrating reed and the sealing members may have a flat bonding face where the bonding layer is formed, the bonding layer formed on the flat bonding face may be formed along an outer periphery of the bonding face, and the bonding layers may be bonded together along the top face of the bank portion and the outer periphery of the bonding face.

In this case, since at least one of the piezoelectric vibrating reed and the sealing members has a flat bonding face where the bonding layer is formed, the bonding layer formed on the flat bonding face is formed along an outer periphery of the bonding face, and the bonding layers are bonded together along the top face of the bank portion and the outer periphery of the bonding face, it is possible, at the time of bonding the plurality of sealing members, to suppress scattering of the bonding layers to the hermetically sealed excitation electrodes of the piezoelectric resonator plate.

With the above configuration, the intermetallic compound may be formed so as to be biasedly postioned within the bonding material.

In this case, since the intermetallic compound is formed so as to be biasedly postioned within the bonding material, the bonding material has heat resistance to heating temperatures in bonding the piezoelectric resonator device to a mounting substrate using technology such as reflow soldering. As a result, stable bonding of the plurality of sealing members is possible.

With the above configuration, the intermetallic compound may be formed extending between two ends of the bonding material that bonds the sealing members or that bonds the piezoelectric resonator plate and the sealing members.

In this case, the intermetallic compound is formed extending between two ends of the bonding material that bonds the sealing members or that bonds the piezoelectric resonator plate and the sealing members. Therefore, at the time of reflow soldering, the intermetallic compound enables the bonding material to resist melting during reflow soldering and bond the plurality of sealing members.

With the above configuration, the intermetallic compound may be concentrated around the narrowest gap between two ends of the bonding material.

In this case, since the intermetallic compound is concentrated around the narrowest gap between two ends of the bonding material, the biasedly postioned intermetallic compound is preferable for resisting environmental temperatures during reflow soldering and bonding the members with the bonding material.

With the above configuration, the narrowest gap may range from 3 to 20 μm.

In this case, since the narrowest gap ranges from 3 to 20 μm, it is possible to concentrate the intermetallic compound around the narrowest gap under good conditions and further to maintain a good fillet shape of the bonding material for bonding. Accordingly, this configuration enables the members to be firmly bonded to one another with the bonding material that contains the intermetallic compound, and it is also preferable for reducing the size of the piezoelectric resonator device. In contrast, in the case where the narrowest gap is less than 3 μm, a portion around this gap is weakened and accordingly the strength of the bonding material is reduced. In the case where the narrowest gap is over 20 μm, the fillet of the bonding material becomes small and accordingly the bonding strength of the members is reduced. In addition, the amount of the intermetallic compound to be generated within the bonding material may be relatively reduced, which may reduce the heat resistance.

With the above configuration, the bonding layers may contain both Cu and Sn.

In this case, since the bonding layers contain both Cu and Sn, the Cu and Sn dispersed in the bonding layers are bound together (e.g., $Cu_6Sn_5$ or $Cu_3Sn$) at the time of bonding the members, and the intermetallic compound of Cu and Sn is biasedly postioned. In the case where the Cu and Sn of the bonding layers have already been bound together (in the case where the intermetallic compound already exists), the intermetallic compound of the Cu and Sn is biasedly postioned. In order to attain the above object, a manufacturing method for the piezoelectric resonator device according to the present invention is a manufacturing method for the piezoelectric resonator device according to the present invention. The method includes forming the bonding layer having a Sn—Cu layer as an uppermost layer, on one of the plurality of sealing members, and forming the bonding layer having a Cu layer as an uppermost layer, on another one of the sealing members that is bonded to the one sealing member, the Cu layer having a smaller area than the Sn—Cu layer, wherein the Sn—Cu layer and the Cu layer are bonded to each other by heating.

According to the present invention, the method achieves the action and effect of the piezoelectric resonator device according to the present invention. Furthermore, since the bonding layer having the Sn—Cu layer as an uppermost layer is formed on one of the plurality of sealing members, the bonding layer having the Cu layer as an uppermost layer is formed on another one of the sealing members that is bonded to the one sealing member, by forming the Cu layer as an uppermost layer, the Cu layer having a smaller area than the Sn—Cu layer, and the Sn—Cu layer and the Cu layer are bonded to each other by heating, it is possible to facilitate the concentration of the intermetallic compound into the central part of the bonding material.

Effects of the Invention

With the piezoelectric resonator device and the manufacturing method therefor according to the present invention, it is possible to resist melt temperatures during reflow soldering.

MODE FOR CARRYING OUT THE INVENTION

Hereinbelow, embodiments of the present invention will be described with reference to the drawings. It should be noted that the following embodiments take the example of the case where a crystal resonator to which the present invention is applied is used as a piezoelectric resonator device.

Figure 1:
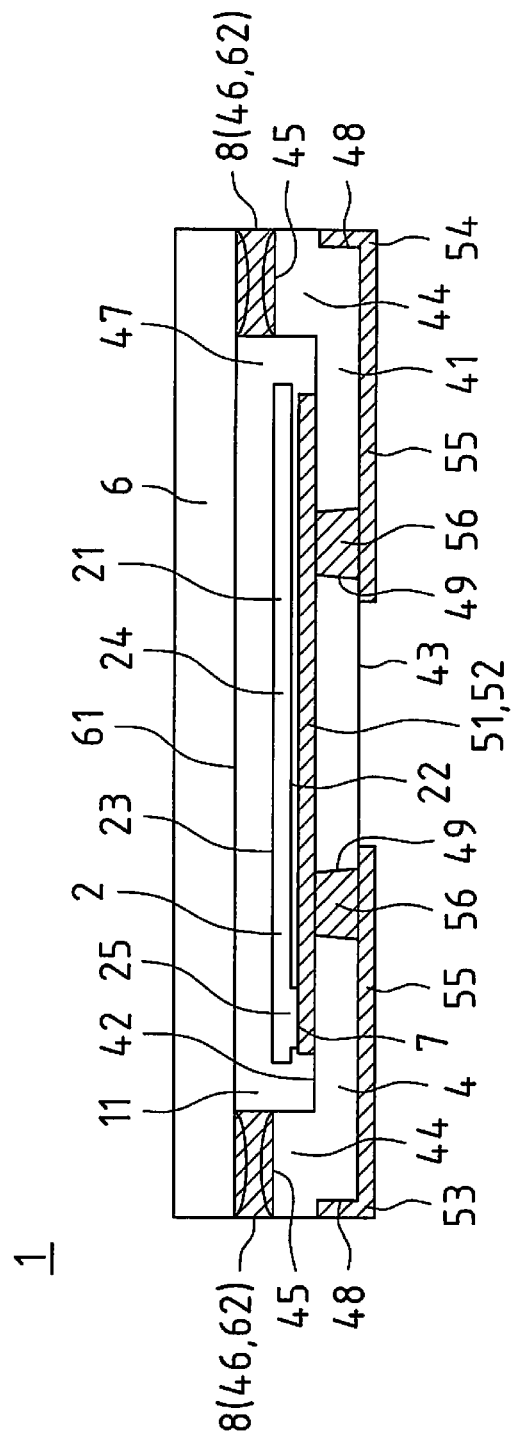
FIG. 1 is a schematic cross-sectional view showing an internal space of a crystal resonator according to an embodiment.

As shown in FIG. 1, a crystal resonator 1 according to the present embodiment is provided with a crystal resonator plate 2 (called a piezoelectric resonator plate in the present invention) made of AT-cut crystal, a base 4 (called a sealing member in the present invention) on which the crystal resonator plate 2 is held and with which the crystal resonator plate 2 is hermetically sealed, and a lid 6 (called a sealing member in the present invention) with which the crystal resonator plate 2 held on the base 4 is hermetically sealed.

In the crystal resonator 1, a package is made up of the base 4 and the lid 6. The base 4 and the lid 6 are bonded to each other via a base bonding layer 46 and a lid bonding layer 62, and this bonding produces a hermetically sealed internal space 11. In the internal space 11, the crystal resonator plate 2 is electromechanically bonded to the base 4 with ultrasonic waves by flip chip bonding (FCB) via a conductive bump 7.

Next is a description of each constituent element of the crystal resonator 1 with reference to FIGS. 1 to 4.

Base 4

Figure 2:
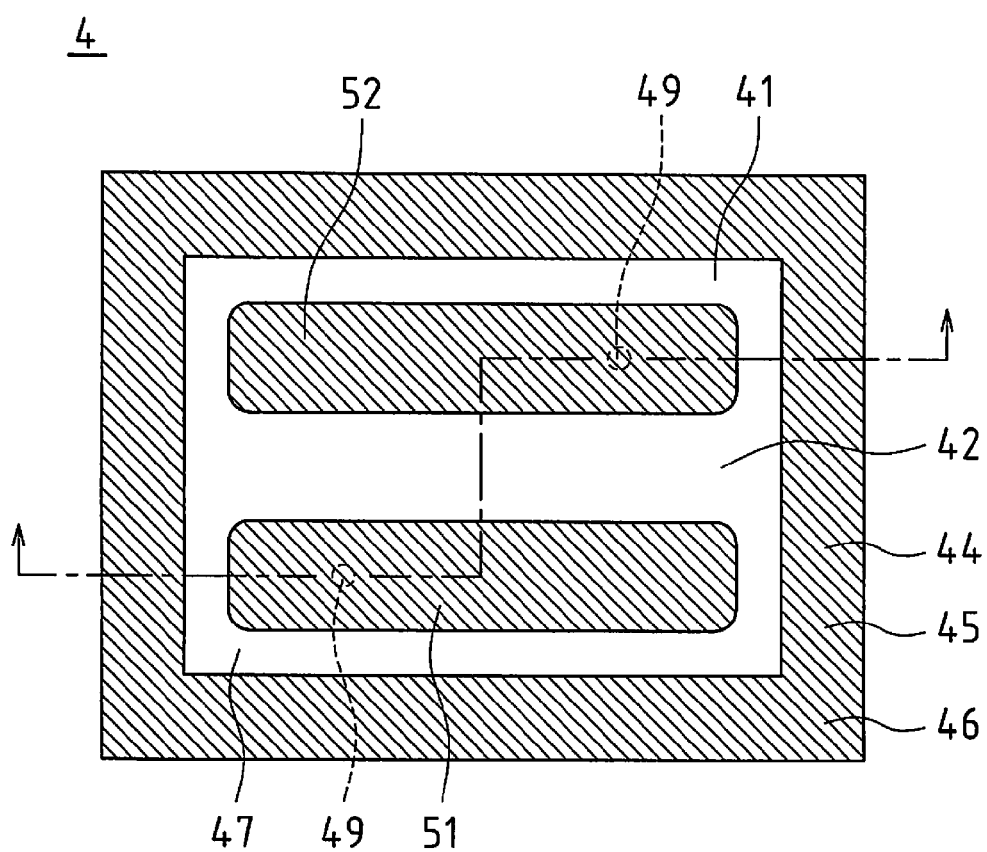
FIG. 2 are a schematic plan view and a schematic cross-sectional view of a base according to the embodiment.
Figure 2:
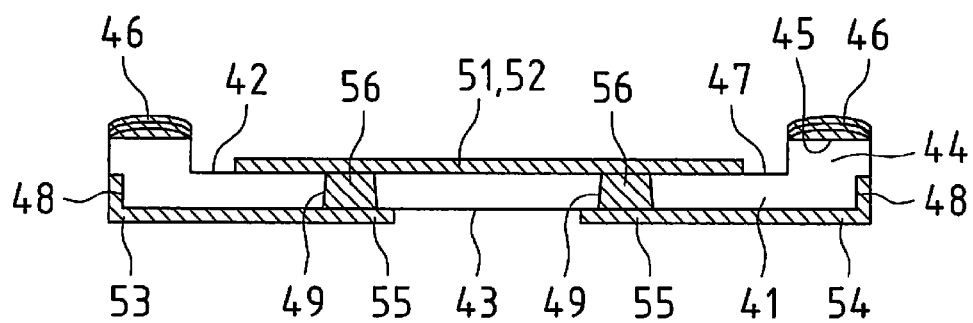

The base 4 is made of ceramic, and as shown in FIG. 2, it is formed in the shape of a box made up of a bottom portion 41 and a bank portion 44 that extends upward from the bottom portion 41 along the outer periphery of one main face 42 of the base 4. This base 4 is formed by laminating a ring-shaped body of ceramic over a single plate of ceramic and integrally firing these parts to create a recessed shape. The dimensions of the base 4 in plan view are set to 3.2 mm×2.5 mm or less. In the present embodiment, the base 4 with dimensions of 2.5 mm×2.0 mm in plan view is used.

A top face 45 of the bank portion 44 of the base 4 is a bonding face bonded to the lid 6, and the lead-free base bonding layer 46 (called a bonding layer in the present invention) that is bonded to the lid 6 is formed on the top face 45. In the present embodiment, the top face 45 of the bank portion 44 of the base 4 serves as a bonding part of the base 4 where the base bonding layer 46 has been formed.

The base bonding layer 46 is formed in a raised shape and is made up of thin films configured by firing a W layer made of W on the top face 45 of the bank portion 44 to integrate with the top face 45 of the bank portion 44, then forming an Ni layer made of Ni on the W layer, and then forming an Au layer made of Au on the Ni layer. The W layer is softened when fired to be integrated with the top face 45 of the bank portion 44 of the base 4, and so the exterior (surface) of the W layer is curved. As a result, the W layer as a whole is formed in a raised shape. In this way, since the W layer is formed with the curved exterior on the top face 45 of the bank portion 44 of the base 4, the base bonding layer 46 is formed in a raised shape on the top face 45 of the bank portion 44 of the base 4. In the present embodiment, the lowermost layer of the base bonding layer 46 is the W layer, but the present invention is not limited to this, and an Mo layer made of Mo may be used instead.

The base 4 also has formed therein a cavity 47 that is surrounded by the bottom portion 41 and the bank portion 44. As shown in FIG. 2, this cavity 47 is formed in a rectangular shape in plan view. In the present embodiment, the cavity 47 is oblong rectangular in plan view.

The base 4 further has castellations 48 formed at the four corners of the back face (other main face 43) of the housing of the base 4. These castellations 48 are formed in the side faces of the housing along the four corners of the other main face 43 of the base 4.

Also, as shown in FIG. 2, the base 4 has formed therein electrode pads 51 and 52 in a pair that are electromechanically bonded respectively to excitation electrodes 31 and 32 of the crystal resonator plate 2, external terminal electrodes 53 and 54 that are electrically connected to external components or external devices, and wiring patterns 55 that provide electrical connections between the electrode pad 51 and the external terminal electrode 53 and between the electrode pad 52 and the external terminal electrode 54. The electrode pads 51 and 52, the external terminal electrodes 53 and 54, and the wiring patterns 55 constitute electrodes of the base 4. The electrode pads 51 and 52 are formed side by side in a direction along the short sides thereof along the longitudinal direction of the cavity 47 of the base 4. The external terminal electrodes 53 and 54 are formed in the castellations 48. The electrode pads 51 and 52, the external terminal electrodes 53 and 54, and the wiring patterns 55 have a configuration made of the same materials as the base bonding layer 46, and therefore are formed simultaneously with the base bonding layer 46.

Also, as shown in FIG. 2, the base 4 has formed therein vias 49 for electrical conduction of the excitation electrodes 31 and 32 of the crystal resonator plate 2 from inside the cavity 47 to the outside of the cavity 47. Through these vias 49, the wiring patterns 55 are formed from the electrode pads 51 and 52 on the one main face 42 of the base 4 to the external terminal electrodes 53 and 54 on the other main face 43. The inner side faces of the vias 49 are tapered with an inclination relative to the one main face 42 and the other main face 43 of the base 4. One ends of the vias 49 that correspond to the one main face 42 of the base 4 have a minimum diameter, whereas the other ends of the vias 49 that correspond to the other main face 43 of the base 4 have a maximum diameter. Furthermore, a conducting member 56 made of W is fired to be integrated with the base 4 inside the vias 49.

Lid 6

Figure 3:
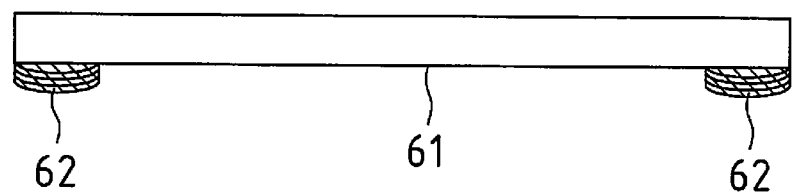
FIG. 3 are a schematic side view and a schematic bottom view of a lid according to the embodiment.
Figure 3:
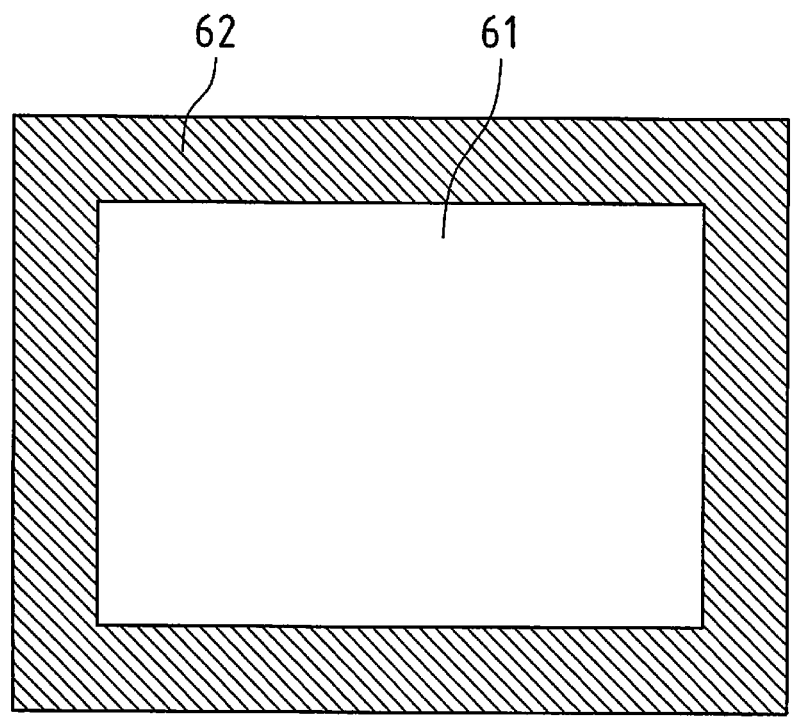

The lid 6 is made of ceramic and is formed as a single parallelepiped plate that is rectangular in plan view. A bottom face 61 of the lid 6 is a bonding face for bonding to the base 4, and as shown in FIG. 3, it is formed as a flat face. The dimensions of the lid 6 in plan view are set to 3.2 mm×2.5 mm or less. In the present embodiment, a substrate with dimensions of 2.5 mm×2.0 mm in plan view is used.

The bottom face 61 of the lid 6 is a bonding face bonded to the base 4, and the lid bonding layer 62 (called a bonding layer in the present invention) that is bonded to the base 4 is formed on the bottom face 61. In the present embodiment, the bottom face 61 of the lid 6 (specifically, a part along the outer periphery of the bottom face 61) serves as a bonding part of the lid 6 where the lid bonding layer 62 has been formed.

The lid bonding layer 62 is formed in a raised shape along the outer periphery of the bottom face 61 of the lid 6, and corresponds to the top face 45 of the bank portion 44 of the base 4. The lid bonding layer 62 has a multilayer structure configured by firing a W layer made of W on the bottom face 61 of the lid 6 to integrate with the bottom face 61 of the lid 6, then forming an Ni layer made of Ni on the W layer, then forming a Cu layer made of Cu on the Ni layer, and then forming an Sn—Cu brazing material on the Cu layer. The W layer is softened when fired to be integrated with the bottom face 61 of the lid 6, and so the exterior (surface) of the W layer is curved. As a result, the W layer as a whole is formed in a raised shape. In this way, since the W layer is formed with the curved exterior on the bottom face 61 of the lid 6, the lid bonding layer 62 is formed in a raised shape along the outer periphery of the bottom face 61 of the lid 6. In the present embodiment, the lowermost layer of the lid bonding layer 62 is the W layer, but the present invention is not limited to this, and an Mo layer made of Mo may be used instead.

In the crystal resonator 1, the lid 6 is temporarily bonded to the base 4 by FCB and is thereafter permanently bonded thereto by melting the Sn—Cu brazing material through atmospheric heating. This constitutes the package of the crystal resonator 1 made up of the lid 6 and the base 4.

Crystal Resonator Plate 2

Figure 4:
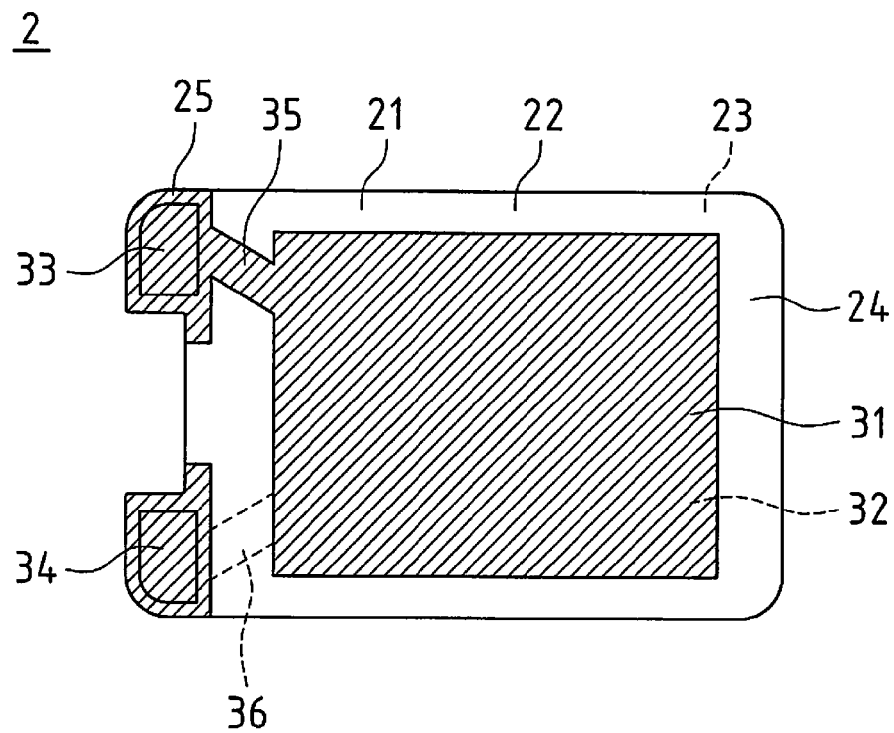
FIG. 4 is a schematic bottom view of a crystal resonator plate according to the embodiment.

The crystal resonator plate 2 is constituted by a substrate 21 made of AT-cut crystal plate, and as shown in FIG. 4, its external shape is a single plate of rectangular parallelepiped shape that is substantially rectangular in plan view (both main faces 22 and 23 are formed in a substantially rectangular shape). In the present embodiment, the opposing long sides of the crystal resonator plate 2 in plan view are referred to as "one side" and the "other side".

The crystal resonator plate 2 includes a resonator portion 24 that constitutes a resonator region, and a bonding portion 25 that is bonded to the electrode pads 51 and 52 of the base 4 that are external electrodes. The resonator portion 24 and the bonding portion 25 are integrally formed into the substrate 21. The bonding portion 25 has a cut-out portion at a middle position of a short side of the substrate 21 in plan view.

The crystal resonator plate 2 has formed therein a pair of excitation electrodes 31 and 32 that causes excitation, a pair of terminal electrodes 33 and 34 that is electromechanically bonded to the electrode pads 51 and 52 of the base 4, and draw-out electrodes 35 and 36 that draw out the pair of excitation electrodes 31 and 32 to the pair of terminal electrodes 33 and 34. The excitation electrodes 31 and 32 in a pair are drawn respectively by the extraction electrodes 35 and 36 and are electrically connected respectively to the terminal electrodes 33 and 34 in a pair.

The excitation electrodes 31 and 32 in a pair are formed opposed to each other on the main faces 22 and 23 of the substrate 21 and in the center of the resonator portion 24 in plan view. The pair of excitation electrodes 31 and 32 is composed of, for example, a Cr—Au film configured by laminating first Cr and then Au from the substrate 21 side.

The pair of terminal electrodes 33 and 34 is formed on the other main face 23 of the bonding portion 25. Of the pair of terminal electrodes 33 and 34, the terminal electrode 33 is formed at the one side and its vicinity of the substrate 21, and the other terminal electrode 34 is formed at the other side and its vicinity. Like the excitation electrodes 31 and 32, the pair of terminal electrodes 33 and 34 is composed of, for example, a Cr—Au film configured by laminating first Cr and then Au from the substrate 21 side. Also, as shown in FIGS. 1 and 4, the pair of terminal electrodes 33 and 34 has a two-layer structure consisting of upper and lower layers, the upper layer being made of Au and the lower layer being made of Cr. The main faces (the faces as viewed in plan view) of the lower layer have a larger area than the main faces (the faces as viewed in plan view) of the upper layer.

The extraction electrodes 35 and 36 are formed on the resonator portion 24 and the bonding portion 25, extending from the resonator portion 24 to the bonding portion 25. The extraction electrodes 35 and 36 are formed on the main faces 22 and 23 of the substrate 21, without opposing each other. Like the excitation electrodes 31 and 32, the extraction electrodes 35 and 36 are composed of, for example, a Cr—Au film configured by laminating first Cr and then Au from the substrate 21 side.

Crystal Resonator 1

In the crystal resonator 1 with the above configuration, as shown in FIG. 1, the base 4 and the crystal resonator plate 2 are electromechanically bonded to each other with ultrasonic waves by FCB via the conductive bump 7. By this bonding, the excitation electrodes 31 and 32 of the crystal resonator plate 2 are electromechanically bonded to the electrode pads 51 and 52 of the base 4 via the extraction electrodes 35 and 36, the terminal electrodes 33 and 34, and the conductive bump 7, and thereby the crystal resonator plate 2 is mounted on the base 4. Note that the conductive bump 7 is a plated bump of non-flowable material. The plated bump as used herein refers to a metal film formed by plating, and is configured by generating a metal film on a base metal layer (seed layer) by electrolytic plating or the like. The film thickness of the bump 7 may be controlled depending on the plating conditions, and so it is possible to form the bump as a thick film. Also, the shape of the upper face of the metal film may be determined by the shape of the base metal layer, and so it is possible to flatten the shape of the upper face of the metal film or to make the upper face of the metal film into a raised shape.

Figure 5:
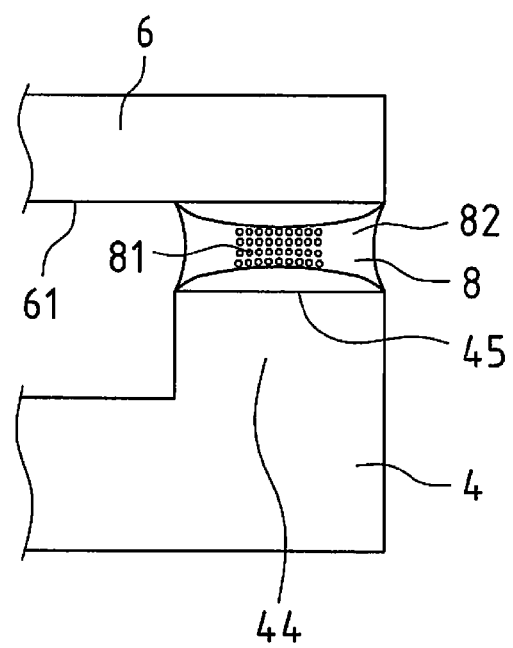
FIG. 5 is an enlarged side view illustrating how the base and the lid are connected according to the embodiment.

Then, the lid 6 is bonded (specifically, bonded with ultrasonic waves) by heat melting (specifically, by FCB) to the base 4 on which the crystal resonator plate 2 is mounted, via the base bonding layer 46 of the base 4 and the lid bonding layer 62 of the lid 6. This produces the crystal resonator 1 in which the crystal resonator plate 2 is hermetically sealed. By bonding the base bonding layer 46 and the lid bonding layer 62, a bonding material 8 that contains an Sn—Cu alloy 81, which is an intermetallic compound, is formed from the base bonding layer 46 and the lid bonding layer 62 as shown in FIG. 5. Note that in the bonding material 8, no metal diffusion occurs (i.e., W does not diffuse) and therefore the W layers remain. The narrowest gap between the base 4 and the lid 6 bonded via this bonding material 8 is set to the range of 3 to 20 μm. In the present embodiment, this gap is set to 5 μm.

The bonding material 8 has a higher melting point than a melt temperature (e.g., 260° C. or higher) during reflow soldering. As shown in FIG. 5, the bonding material 8 has the Sn—Cu alloy 81 formed extending between two ends of the bonding material 8 (specifically, between the W layer of the base 4 and the W layer of the lid 6) that bonds the base 4 and the lid 6. The Sn—Cu alloy 81 is concentrated around the narrowest gap between the top face 45 of the bank portion 44 of the base 4 (specifically, the W layer fired to be integrated with the top face 45) and the bottom face 61 of the lid 6 (specifically, the W layer fired to be integrated with the bottom face 61). An Sn 82 that was not bonded to Cu and thus not part of the intermetallic compound is concentrated in the other part of the bonding material 8 (other than the part where the Sn—Cu alloy 81 was generated). In the present embodiment, the Sn—Cu alloy 81 is concentrated around the gap between near the top of the raised shape of the top face 45 (specifically, the W layer fired to be integrated with the top face 45) of the bank portion 44 of the base 4 and near the top of the raised shape of the bottom face 61 (specifically, the W layer fired to be integrated with the bottom face 61) of the lid 6 that faces the top of the raised shape of the top face 45.

With the crystal resonator 1 according to the present embodiment, the base 4 and the lid 6 that hermetically seal the crystal resonator plate 2 are provided, the base 4 is provided with the bank portion 44, the base bonding layer 46 is formed on the top face 45 of the bank portion 44, and the lid bonding layer 62 is formed on the lid 6. Then, the base 4 and the lid 6 are bonded to each other via the base bonding layer 46 and the lid bonding layer 62, and the bonding material 8 containing the intermetallic compound (Sn—Cu alloy 81) is formed. Accordingly, the bonding of the base 4 and the lid 6 is achieved with the bonding material 8 that contains the Sn—Cu alloy 81 having a higher melting temperature than solder. As a result, the heat resistance of the bonding material 8 is improved, and it is possible to resist melt temperatures during reflow soldering without the Sn—Cu alloy 81 melting even during reflow soldering, and to enable the Sn—Cu alloy 81 to maintain the hermetic sealing of the crystal resonator plate 2 by the base 4 and the lid 6.

Furthermore, since the top face 45 of the base 4 is curved in a raised shape, the distance between the top of the raised shape of the top face 45 and the bottom face 61 of the lid 6 that faces the top of the raised shape becomes the shortest. As a result, it is possible, at the time of bonding the base 4 and the lid 6, to concentrate the intermetallic compound (Sn—Cu alloy 81) around the top of the raised shape of the top face 45.

Furthermore, the lid bonding layer 62 is formed in correspondence with the base bonding layer 46 along the outer periphery of the bottom face 61 of the lid 6 that is formed as a flat face. And, the base bonding layer 46 and the lid bonding layer 62 are bonded to each other along the top face 45 of the bank portion 44 of the base 4 and the outer periphery of the bottom face 61 of the lid 6. Accordingly, it is possible, at the time of bonding the base 4 and the lid 6, to suppress scattering of the base bonding layer 46 and the lid bonding layer 62 to the crystal resonator plate 2 that is hermetically sealed in the internal space 11.

Furthermore, the intermetallic compound (Sn—Cu alloy 81) is formed extending between the base 4 and the lid 6 and is biasedly postioned within the bonding material 8. Therefore, at the time of reflow soldering, the Sn—Cu alloy 81 enables the bonding material 8 to resist melting during reflow soldering and to bond the base 4 and the lid 6 to each other.

Furthermore, since the base bonding layer 46 and the lid bonding layer 62 are formed in a raised shape, the distance between the top of a raised shape and a target to be bonded (the base 4 or the lid 6) that faces the top of that raised shape becomes the shortest. As a result, it is possible, at the time of bonding, to concentrate the intermetallic compound (Sn—Cu alloy 81) around the tops of the raised shapes.

Furthermore, since the intermetallic compound (Sn—Cu alloy 81) is formed so as to be concentrated around the narrowest gap between the two ends of the bonding material 8, the biasedly postioned Sn—Cu alloy 81 is preferable for resisting environmental temperatures during reflow soldering and bonding the members (in the present embodiment, the base 4 and the lid 6) with the bonding material 8.

Furthermore, since the narrowest gap is in the range of 3 to 20 μm, it is possible to concentrate the intermetallic compound (Sn—Cu alloy 81) around the narrowest gap under good conditions and further to maintain a good fillet shape of the bonding material 8 for bonding. Accordingly, with this configuration, it is possible to firmly bond the members (in the present embodiment, the base 4 and the lid 6) with the bonding material 8 that contains the Sn—Cu alloy 81. This is preferable for reducing the size of the crystal resonator 1. In contrast, in the case where the narrowest gap is less than 3 μm, this gap portion is weakened and accordingly the strength of the bonding material is reduced. In the case where the narrowest gap is over 20 μm, the fillet of the bonding material becomes small and accordingly the bonding strength of each member is reduced. In addition, the amount of the intermetallic compound to be generated within the bonding material may be relatively reduced, which may reduce heat resistance.

Furthermore, since the bonding layer 8 contains Cu and Sn, the Cu and Sn dispersed in the bonding layer (the base bonding layer 46 and the lid bonding layer 62) are bound together (e. g., $Cu_6Sn_5$ or $Cu_3Sn$) at the time of bonding the members (in the present embodiment, the base 4 and the lid 6), and the intermetallic compound (Sn—Cu alloy 81) of the Cu and Sn is biasedly postioned. In the case where the Cu and Sn included in the base bonding layer 46 and the lid bonding layer 62 have already been bound together (in the case where the Sn—Cu alloy 81 already exists), the Sn—Cu alloy 81 of the Cu and Sn is biasedly postioned.

In the present embodiment, the crystal resonator is applied as a piezoelectric resonator device, but the present invention is not limited to this, and some other device may be used instead as long as it is a piezoelectric resonator device in which the excitation electrodes of the piezoelectric resonator plate that cause piezoelectric resonance is hermetically sealed. For example, a crystal oscillator may be used instead.

Figure 6:
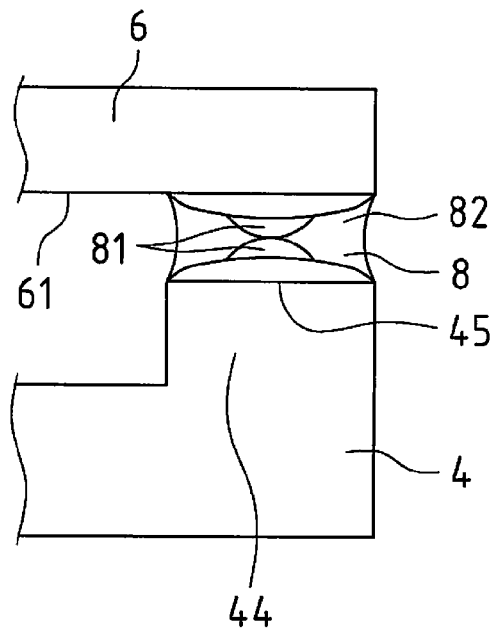
FIG. 6 is an enlarged side view corresponding to FIG. 5, illustrating how the base and the lid are connected according to another embodiment.
Figure 7:
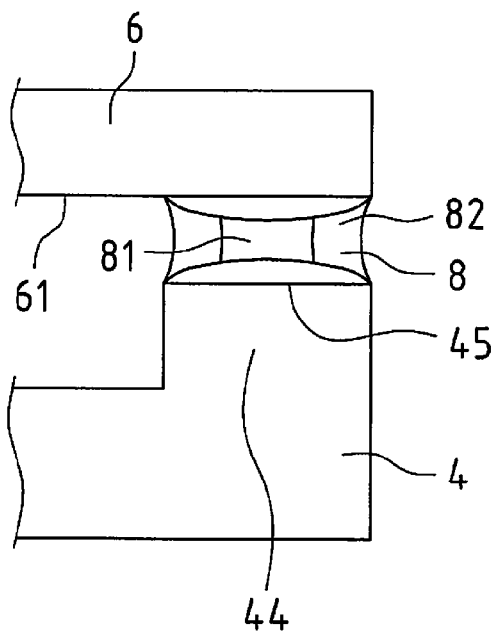
FIG. 7 is an enlarged side view corresponding to FIG. 5, illustrating how the base and the lid are connected according to another embodiment,.

Also, in the present embodiment, the bonding material 8 is bonded as shown in FIG. 5, but the present invention is not limited to this, and the bonding material 8 may be bonded as shown in FIG. 6 or 7. A comparison between the bonding state shown in FIG. 5 and the bonding states shown in FIGS. 6 and 7 shows that in the case of the bonding material 8 bonded as shown in FIGS. 6 and 7, the Sn—Cu alloy 81 of the bonding material 8 is more concentrated around the narrowest gap between the base 4 and the lid 6. Accordingly, the bonding materials 8 bonded as shown in FIGS. 6 and 7 are more preferable because they have heat resistance superior to that of the bonding material bonded as shown in FIG. 5.

Furthermore, in the present embodiment, the pair of terminal electrodes 33 and 34 formed on the flat substrate 21 has a two-layer structure, but the present invention is not limited to this, and a configuration is also possible in which a portion of the crystal substrate where the pair of terminal electrodes 33 and 34 is to be formed is formed in a raised shape, and the pair of terminal electrodes with a single-layer or multilayer structure including Cr and Au is formed on the portion of the substrate formed in a raised shape.

Furthermore, in the present embodiment, the pair of terminal electrodes 33 and 34 has a two-layer structure, but the present invention is not limited to this, and the terminal electrodes 33 and 34 may have a single-layer structure, or may have a multilayer structure including three or more layers.

Furthermore, in the present embodiment, the conducting member 56 is made of Cu, but the present invention is not limited to this, and the conducting member 56 may be made of an Au—Sn alloy in which Au and Sn are evenly mixed by melt diffusion of Au and Sn. In this case, inside the vias 49, the end faces of the conducting member 56 at the two main faces 42 and 43 of the base 4 are pulled respectively in the planar directions of the main faces 42 and 43 due to melt diffusion of Au and Sn, and are formed in a recessed shape with respect to the two main faces 42 and 43 of the base 4. This melt diffusion of Au and Sn provides good bonding of the base 4 and the conducting member 56 and suppresses generation of a gap between the base 4 and the conducting member 56, thus suppressing poor filling of the conducting member 56 in the base 4.

Furthermore, in the present embodiment, the resonator portion 24 and the bonding portion 25 have the same thickness, but the present invention is not limited to this, and the resonator portion 24 may have a smaller thickness in order to support higher frequencies.

Furthermore, in the present embodiment, ceramic is used for the base 4, but the present invention is not limited to this, and crystal, which is the same material as that of the crystal resonator plate 2, or a glass material such as borosilicate glass, or silicon or sapphire may be used for the base 4. In this case, micromachining using photolithography is possible. This is preferable for ultrasmall piezoelectric resonator devices and for suppressing the material cost.

For example, in the case where glass, crystal, or any other such material is used for the base 4, the base bonding layer 46 formed on the top face 45 of the bank portion 44 of the base 4 may have a multilayer structure configured by forming one of a Cr layer made of Cr, an Mo layer made of Mo, and an Ni layer made of Ni on the top face 45 of the base 4, then forming thereon an Au layer made of Au, and then forming an Sn—Cu brazing material on the Au layer.

As another alternative, an insulating plate such as ceramic may be used as a base material of the base 4, and the base 4 may have a layered structure configured by laminating a metal frame, such as Kovar, on the outer peripheral edge of the upper face of the insulating plate. In this case, it is possible to provide insulation between terminals of the electric wiring pattern.

Note that, with the above configurations, the base bonding layer 46 formed on the top face 45 of the base 4 may have a multilayer structure configured by forming a Cu strike plating made of Cu on the top face 45 of the base 4, then forming a Cu layer made of Cu on the strike plating and on the top face 45, and then forming an Sn—Cu brazing material on the Cu layer. As another alternative, the base bonding layer 46 may have a multilayer structure configured by alternately laminating an Sn layer made of Sn and a Cu layer made of Cu on the top face 45 of the base 4 and then forming an Sn—Cu brazing material on the Cu layer.

Furthermore, in the present embodiment, ceramic is used for the lid 6, but the present invention is not limited to this, and crystal, which is the same material as that of the crystal resonator plate 2, or a glass material such as borosilicate glass, or silicon or sapphire may be used for the lid 6. As another alternative, a metal material such as Kovar may be used for the lid 6.

For example, in the case where Kovar is used for the lid 6, the lid bonding layer 62 formed on the bottom face 61 of the lid 6 may have a multilayer structure configured by forming a Cu strike plating made of Cu on the bottom face 61 of the lid 6, then forming a Cu layer made of Cu on the strike plating and on the bottom face 61, and then forming an Sn—Cu brazing material on the Cu layer. As another alternative, in the case where Kovar is used for the lid 6, the lid bonding layer 62 may have a multilayer structure configured by alternately laminating an Sn layer made of Sn and a Cu layer made of Cu on the bottom face 61 of the lid 6 and then forming an Sn—Cu brazing material on the Cu layer.

In the case where glass, crystal, or any other such material is used for the lid 6, the lid bonding layer 62 formed on the bottom face 61 of the lid 6 may have a multilayer structure configured by forming one of a Cr layer made of Cr, an Mo layer made of Mo, and an Ni layer made of Ni on the bottom face 61 of the lid 6, then forming thereon an Au layer made of Au, and then forming an Sn—Cu brazing material on the Au layer. In the present embodiment, the Au layer is formed, but the present invention is not limited to this, and no Au layer may be formed.

Furthermore, in the present embodiment, Cu is used for the base bonding layer 46 and the lid bonding layer 62, but the present invention is not limited to this, and Au may be used instead of Cu to make an Au—Sn configuration of Au and Sn.

Furthermore, the bonding material 8 according to the present embodiment desirably contains Ni or Co. In this case, even if thermal hystory (such as a reflow test or thermal hystory with age) is applied to the bonding material 8 after the generation of the bonding material 8, the presence of Ni or Co prevents the Sn of the bonding material 8 from reacting with the base bonding layer 46 (e.g., Au or Ni) and the lid bonding layer 62 (e.g., Au or Ni) and thereby eroding the base bonding layer 46 and the lid bonding layer 62. This consequently suppresses falling-off of the bonding material 8 from the base 4 and the lid 6. As an example of a specific embodiment, a metal layer made of Ni or Co may be formed as the uppermost layer of the base bonding layer 46 and/or the uppermost layer of the lid bonding layer 62 prior to the generation of the bonding material 8. In the case where glass, crystal or any other such material is used for the base 4, even if Cr, Mo, or Ni is used as the lowermost layer of the base bonding layer 46, the presence of Ni or Co prevents the Sn of the bonding material 8 from reacting with the base bonding layer 46 (e.g., Au or Ni) and the lid bonding layer 62 (e.g., Au or Ni) and thereby eroding the base bonding layer 46 and the lid bonding layer 62. Note that Ni or Co does not necessarily have to be the uppermost layer, and a configuration is also possible in which Ni or Co is included in the base bonding layer 46 and/or the lid bonding layer 62 (e.g., a configuration in which Ni or Co is an intermediate layer of the base bonding layer 46 and/or an intermediate layer of the lid bonding layer 62).

Furthermore, the bonding material 8 according to the present embodiment desirably contains Au or Ag. In this case, even if thermal hystory (such as a reflow test or thermal hystory with age) is applied to the bonding material 8 after the generation of the bonding material 8, the Au or Ag firstly reacts with the Sn of the bonding material 8 and suppresses the reaction of the Sn with the metal materials of the base bonding layer 46 and the lid bonding layer 62. This consequently suppresses falling-off of the bonding material 8 from the base 4 and the lid 6 and enables maintaining stable bonding of the base 4 and the lid 6, thus ensuring hermeticity. As an example of a specific embodiment, Au or Ag may be formed as the uppermost layers of the base bonding layer 46 and/or the uppermost layer of the lid bonding layer 62 prior to the generation of the bonding material 8. Note that the Au or Ag may be formed by plating or vacuum evaporation, or may be formed by application of paste containing Au or Ag.

Furthermore, it is desirable that a metal layer of Au, Ag, or Cu be formed on the surface of the bonding material 8 according to the present embodiment. In this case, even if thermal hystory (such as a reflow test or thermal hystory with age) is applied to the bonding material 8 after the generation of the bonding material 8, the Au, Ag, or Cu firstly reacts with the Sn of the bonding material 8 and suppresses the reaction of the Sn with the base bonding layer 46 or the lid bonding layer 62. This consequently suppresses falling-off of the bonding material 8 from the base 4 and the lid 6 and enables maintaining stable bonding of the base 4 and the lid 6, thus ensuring hermeticity. As an example of a specific embodiment, a metal layer of Au, Ag, or Cu may be formed on the bonding material 8 after the generation of the bonding material 8. The Au, Ag, or Cu may be formed by plating or vacuum evaporation, or may be formed by application of a paste containing such a metal.

Furthermore, in the present embodiment, the base bonding layer 46 is curved in a raised shape on the bank portion 44 of the base 4, and the lid bonding layer 62 is formed with a curve of raised shape on the bottom face 61 of the lid 6, but the present invention is not limited to this, and other embodiments as shown in FIGS. 8 to 13 are possible. Note that FIGS. 8 to 13 showing these other embodiments are schematic configuration diagrams illustrating the base 4 and the lid 6 before being bonded to each other, each as a single unit.

Figure 8:
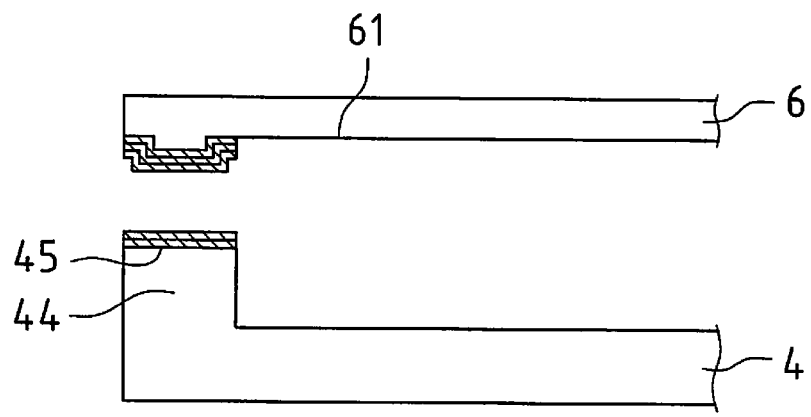
FIG. 8 is a schematic enlarged side view showing the base and the lid before being bonded to each other, each as a single unit, according to another embodiment.

In another embodiment shown in FIG. 8, glass is used for the base 4 and for the lid 6. The top face 45 of the bank portion 44 of the base 4 is formed as a flat face, and the bottom face 61 of the lid 6 for bonding to the base 4 is formed in a raised shape. The bottom face 61 of the lid 6 is formed to have a protrusion in a direction orthogonal to the bottom face 61, and the end face of the protrusion is formed as a flat face. The lid 6 has the lid bonding layer 62 formed by forming, for example, a Cr layer, an Ni layer, or an Mo layer as the lowermost layer on the bottom face 61 of the lid 6, then laminating a Cu layer on the lowermost layer, and then laminating an Sn—Cu layer on the Cu layer. The base 4 has the base bonding layer 46 formed by forming, for example, a Cr layer, an Ni layer, or an Mo layer as the lowermost layer on the top face 45 of the base 4 and then laminating an Au layer on the lowermost layer. In the other embodiment shown in FIG. 8, the gap between the base bonding layer 46 formed on the base 4 and a portion of the lid bonding layer 62 that is formed in a position of the raised end face of the protrusion on the lid 6 is the narrowest gap between the two ends of the bonding material 8, and the intermetallic compound (Sn—Cu alloy 81) is formed so as to be concentrated around this gap.

Figure 9:
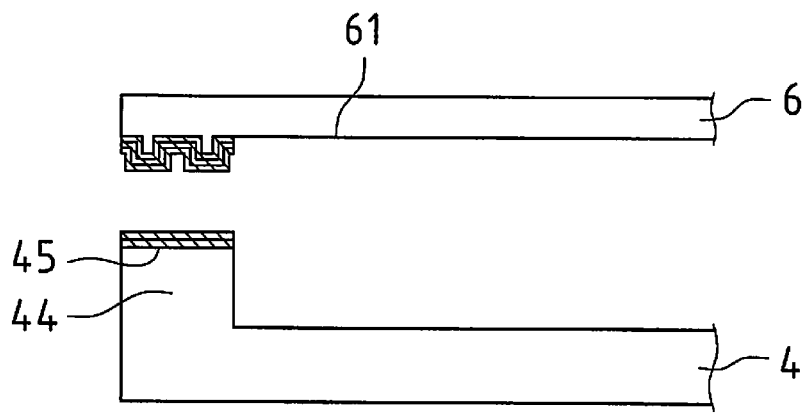
FIG. 9 is a schematic enlarged side view showing the base and the lid before being bonded to each other, each as a single unit, according to another embodiment.

In another embodiment shown in FIG. 9, glass is used for the base 4 and for the lid 6. The top face 45 of the bank portion 44 of the base 4 is formed as a flat face, and the bottom face 61 of the lid 6 for bonding to the base 4 is formed in a raised shape. The bottom face 61 of the lid 6 is formed to have two protrusions in a direction orthogonal to the bottom face 61, and the end faces of these two protrusions are formed as flat faces. The lid 6 has the lid bonding layer 62 formed by forming, for example, a Cr layer, an Ni layer, or an Mo layer as the lowermost layer on the bottom face 61 of the lid 6, then laminating a Cu layer on the lowermost layer, and then laminating an Sn—Cu layer on the Cu layer. The base 4 has the base bonding layer 46 formed by forming, for example, a Cr layer, an Ni layer, or an Mo layer as the lowermost layer on the top face 45 of the base 4 and then laminating an Au layer on the lowermost layer. In the other embodiment shown in FIG. 9, the gaps between the base bonding layer 46 formed on the base 4 and portions of the lid bonding layer 62 that are formed in positions of the two raised end faces of the protrusions on the lid 6 are the narrowest gaps between the two ends of the bonding material 8, and the intermetallic compound (Sn—Cu alloy 81) is formed so as to be concentrated around these gaps. In this case, since there are the two narrowest gaps as compared with the configuration shown in FIG. 8 in which the Sn—Cu alloy 81 is concentrated at a single site, heat resistance is improved.

Figure 10:
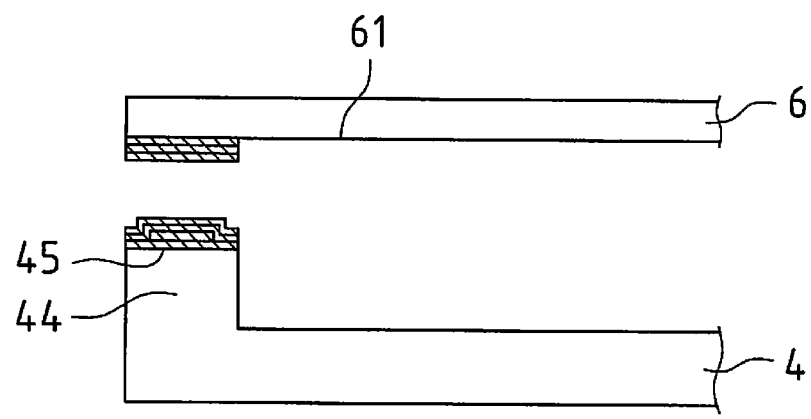
FIG. 10 is a schematic enlarged side view showing the base and the lid before being bonded to each other, each as a single unit, according to another embodiment.

In another embodiment shown in FIG. 10, ceramic is used for the base 4 and for the lid 6. The top face 45 of the bank portion 44 of the base 4 is formed as a flat face, and the bottom face 61 of the lid 6 for bonding to the base 4 is formed as a flat face. The lid 6 has the lid bonding layer 62 formed by forming an Mo layer as the lowermost layer on the bottom face 61 of the lid 6, then laminating a Cu layer on the lowermost layer, and then laminating an Sn—Cu layer on the Cu layer. The base 4 has a W layer formed as the lowermost layer on the top face 45 and has further another W layer formed on part of the lowermost W layer. The base 4 thus has the two stacked W layers formed thereon. Then, an Ni layer is laminated on the two stacked W layers, and an Au layer is laminated on the Ni layer. The lamination of these metals forms the base bonding layer 46. In this way, in the other embodiment shown in FIG. 10, the base bonding layer 46 of the base 4 is formed in a raised shape. Accordingly, for example unlike in the other embodiment shown in FIG. 8, even with such a configuration that both the top face 45 of the bank portion 44 of the base 4 and the bottom face 61 of the lid 6 are formed as flat faces, effects similar to those of the other embodiment shown in FIG. 8 can be achieved by forming the bonding layer(s) (in the present example, the base bonding layer 46) in a raised shape. Furthermore, in the other embodiment shown in FIG. 10, since the base bonding layer 46 is formed in a raised shape, the generation of the intermetallic compound (Sn—Cu alloy 81) is more facilitated than in the other embodiment shown in FIG. 8.

Figure 11:
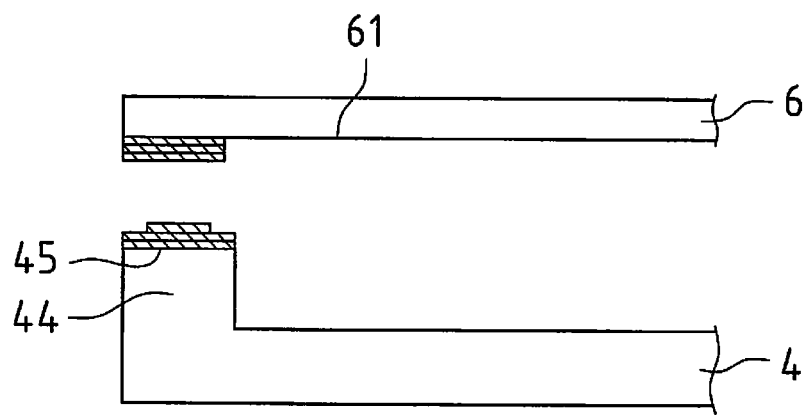
FIG. 11 is a schematic enlarged side view showing the base and the lid before being bonded to each other, each as a single unit, according to another embodiment.

In another embodiment shown in FIG. 11, glass is used for the base 4 and for the lid 6. The top face 45 of the bank portion 44 of the base 4 is formed as a flat face, and the bottom face 61 of the lid 6 for bonding to the base 4 is formed as a flat face. The lid 6 has the lid bonding layer 62 formed by forming, for example, a Cr layer, an Ni layer, or an Mo layer as the lowermost layer on the bottom face 61 of the lid 6, then laminating a Cu layer on the lowermost layer, and then laminating an Sn—Cu layer on the Cu layer. The base 4 has the base bonding layer 46 formed by forming a Cr layer as the lowermost layer on the top face 45 of the base 4, then forming an Au layer on the lowermost layer, and then laminating a Cu layer on part (a central part) of the Au layer. Note that the Cu layer of the base bonding layer 46 of the base 4 has a smaller area than the Sn—Cu layer of the lid bonding layer 62 of the lid 6. In this way, in the other embodiment shown in FIG. 11, the base bonding layer 46 of the base 4 is formed in a raised shape. Accordingly, for example unlike in the other embodiment shown in FIG. 8, even with such a configuration that both the top face 45 of the bank portion 44 of the base 4 and the bottom face 61 of the lid 6 are formed as flat faces, effects similar to those of the other embodiment shown in FIG. 8 can be achieved by forming the bonding layer(s) (in the present example, the base bonding layer 46) in a raised shape. Furthermore, in the other embodiment shown in FIG. 11, since the base bonding layer 46 is formed in a raised shape and the raised portion is the Cu layer, it is possible to facilitate the concentration of the intermetallic compound (Sn—Cu alloy 81) into the central part of the bonding material 8.

Figure 12:
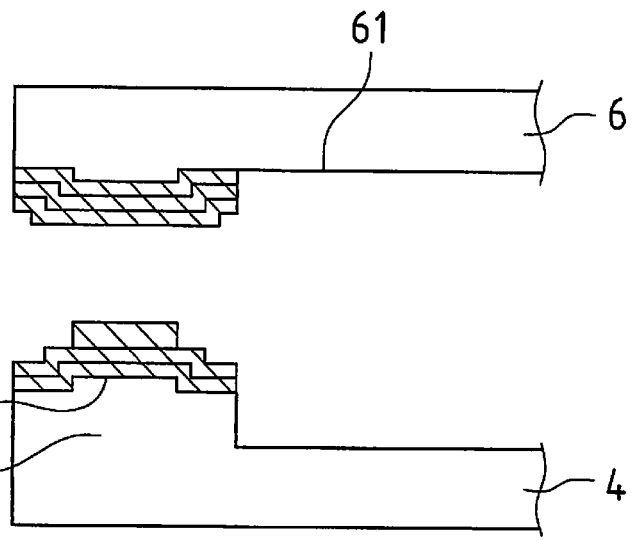
FIG. 12 is a schematic enlarged side view showing the base and the lid before being bonded to each other, each as a single unit, according to another embodiment.

In another embodiment shown in FIG. 12, glass is used for the base 4 and for the lid 6. The top face 45 of the bank portion 44 of the base 4 is formed in a raised shape, and the bottom face 61 of the lid 6 for bonding to the base 4 is formed in a raised shape. The top face 45 of the base 4 is formed to have a protrusion in a direction orthogonal to the top face 45, and the bottom face 61 of the lid 6 is formed to have a protrusion in a direction orthogonal to the bottom face 61, the end faces of the protrusions being formed as flat faces. The lid 6 has the lid bonding layer 62 formed by forming, for example, a Cr layer, a W layer, or an Mo layer as the lowermost layer on the bottom face 61 of the lid 6, then laminating a Cu layer on the lowermost layer, and then laminating an Sn—Cu layer on the Cu layer. The base 4 has the base bonding layer 46 formed by forming, for example, a Cr layer, a W layer, or an Mo layer as the lowermost layer on the top face 45 of the base 4, then laminating an Au layer on the lowermost layer, and then laminating a Cu layer on part (a central part) of the Au layer. Note that the Cu layer of the base bonding layer 46 of the base 4 has a smaller area than the Sn—Cu layer of the lid bonding layer 62 of the lid 6. In addition, the Cu layer of the base bonding layer 46 of the base 4 has a thickness twice or more those of the other layers (e.g., the Au layer) of the base bonding layer 46 of the base 4. In this way, in the other embodiment shown in FIG. 12, since the uppermost Cu layer of the base bonding layer 46 is laminated on part of the Au layer, the central part of the top face 45 of the base 4 protrudes above the other part, and since the upper portion of the base bonding layer 46 and the top face 45 of the base 4 are formed in a raised shape, the intermetallic compound (Sn—Cu alloy 81) is formed so as to be concentrated at the interface between the base 4 and the top face 45 of the bank portion 44 and further into the central part of the top face 45 of the base 4.

Figure 13:
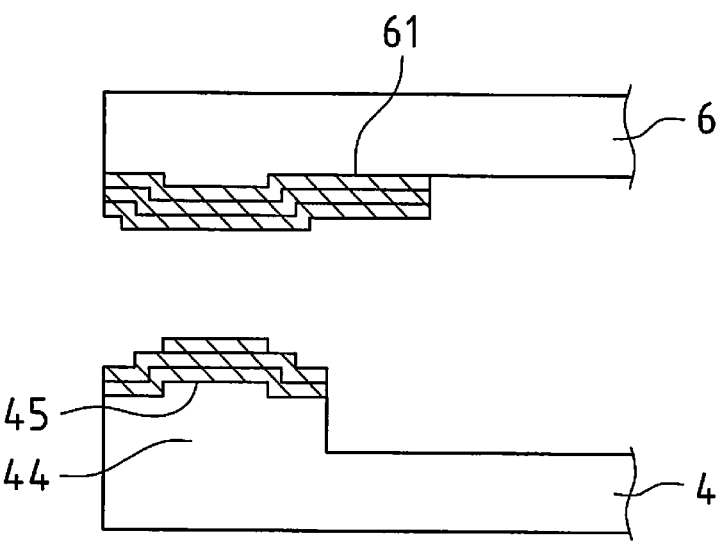
FIG. 13 is a schematic enlarged side view showing the base and the lid before being bonded to each other, each as a single unit, according to another embodiment.

In another embodiment shown in FIG. 13, glass is used for the base 4 and for the lid 6. The top face 45 of the bank portion 44 of the base 4 is formed in a raised shape, and the bottom face 61 of the lid 6 for bonding to the base 4 is formed in a raised shape. The top face 45 of the base 4 and the bottom face 61 of the lid 6 each are formed to have a protrusion in a direction orthogonal to the top face 45 or the bottom face 61, and the end faces of the protrusions are formed as flat faces. The lid 6 has the lid bonding layer 62 formed by forming, for example, a Cr layer, a W layer, or an Mo layer as the lowermost layer on the bottom face 61 of the lid 6, then laminating a Cu layer on the lowermost layer, and then laminating an Sn—Cu layer on the Cu layer. This lid bonding layer 62 is formed not only in a region corresponding to the top face 45 of the base 4, but also formed so as to expand the region inwardly of the bottom face 61 of the lid 6. The base 4 has the base bonding layer 46 formed by forming, for example, a Cr layer, a W layer, or an Mo layer as the lowermost layer on the top face 45 of the base 4, then laminating an Au layer on the lowermost layer, and then laminating a Cu layer on part (a central part) of the Au layer. Note that the Cu layer of the base bonding layer 46 of the base 4 has a smaller area than the Sn—Cu layer of the lid bonding layer 62 of the lid 6. In addition, the Cu layer of the base bonding layer 46 of the base 4 has a thickness equivalent to those of the other layers (e.g., the Au layer) of the base bonding layer 46 of the base 4. In this way, in the other embodiment shown in FIG. 13, since the uppermost Cu layer of the base bonding layer 46 is laminated on part of the Au layer, the central part of the top face 45 of the base 4 protrudes above the other part, and since the upper portion of the base bonding layer 46 and the top face 45 of the base 4 are formed in a raised shape, the intermetallic compound (Sn—Cu alloy 81) is formed so as to be concentrated in the central part of the top face 45 of the base 4. Furthermore, since the lid bonding layer 62 is formed not only in the region corresponding to the top face 45 of the base 4, but also formed so as to expand the region inwardly of the bottom face 61 of the lid 6, it is possible to increase the area of the lid bonding layer 62 in the planar direction (in particular, inwardly). This consequently extends the fillet of the Sn of the bonding material 8 inwardly in the planar direction of the lid 6 at the time of bonding the base 4 and the lid 6, thus improving the bonding strength of the base 4 and the lid 6.

Figure 14:
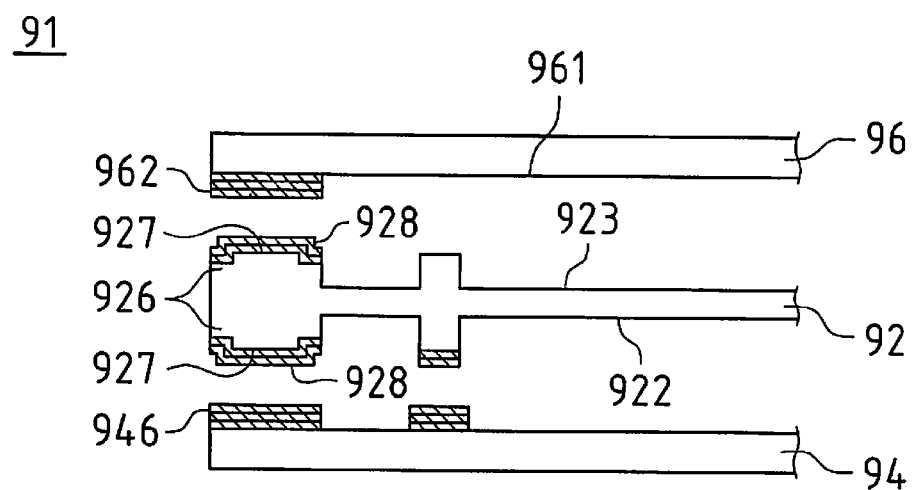
FIG. 14 is a schematic enlarged side view showing a first sealing member, a second sealing member, and the crystal resonator plate before the base and the lid are bonded to each other, according to another embodiment.

Furthermore, in the present embodiment, the package of the crystal resonator 1 is made up of the base 4 and the lid 6, but the present invention is not limited to this. As shown in FIG. 14, a package of a crystal resonator 91 may have a sandwich structure configured by laminating multiple sealing members (one sealing member 94 corresponding to the above base 4 and the other sealing member 96 corresponding to the above lid 6) and a crystal resonator plate 92 one above another.

The crystal resonator 91 with the sandwich structure shown in FIG. 14 is provided with the one sealing member 94 and the other sealing member 96 that hermetically seal excitation electrodes (not shown in FIG. 14) formed on two main faces 922 and 923 of the crystal resonator plate 92. The one sealing member 94 and the other sealing member 96 each have a bonding layer (a first bonding layer 946 corresponding to the above base bonding layer 46 and a second bonding layer 962 corresponding to the above lid bonding layer 62) formed thereon. The crystal resonator plate 92 is provided with bank portions 926, and third bonding layers 928 are formed on top faces 927 of the bank portions 926. The crystal resonator plate 92, the one sealing member 94, and the other sealing member 96 are bonded to one another via their bonding layers (the first bonding layer 946, the second bonding layer 962, and the third bonding layers 928), which forms a bonding material (e.g., the bonding material 8 shown in FIG. 1) that contains an intermetallic compound (e.g., the Sn—Cu alloy 81 shown in FIG. 1). In the other embodiment shown in FIG. 14, the bank portions 926 are provided on the two main faces 922 and 923 of the crystal resonator plate 92, but the present invention is not limited to this, and it is preferable that at least one of the crystal resonator plate 92, the one sealing member 94, and the other sealing member 96 be provided with a bank portion.

In the crystal resonator 91 with such a sandwich structure, the excitation electrode formed on the one main face 922 of the crystal resonator plate 92 is hermetically sealed by the one sealing member 94 and the crystal resonator plate 92, and the excitation electrode formed on the other main face 923 of the crystal resonator plate 92 is hermetically sealed by the other sealing member 96 and the crystal resonator plate 92.

With the piezoelectric resonator device such as a crystal resonator 91 having a sandwich structure shown in FIG. 14, the bonding of the piezoelectric resonator plate and the multiple sealing members is achieved with the bonding material that contains the intermetallic compound having a higher melt temperature than solder. As a result, it is possible to resist melt temperatures during reflow soldering without the intermetallic compound melting even during reflow soldering, and to enable the intermetallic compound to maintain the hermetic sealing of the excitation electrodes of the piezoelectric resonator plate by the multiple sealing members.

As in the above embodiments shown in FIGS. 8, 9, 12, 13, and 14, the bonding part of the base 4 which is formed in a raised shape, the bonding part of the lid 6 which is formed in a raised shape, and the bonding part of the crystal resonator plate 2 which is formed in a raised shape are made of the same materials as those of the base 4, the lid 6, and the crystal resonator plate 2, respectively. Accordingly, there are no differences found in the thermal expansion coefficient and it is unlikely that unnecessary stress will occur in the bonding part during heat bonding. As a result, it is possible to improve the reliability of hermetic sealing. Note that a bonding part of a raised shape may be formed in one of the base 4 and the lid 6.

Figure 15:
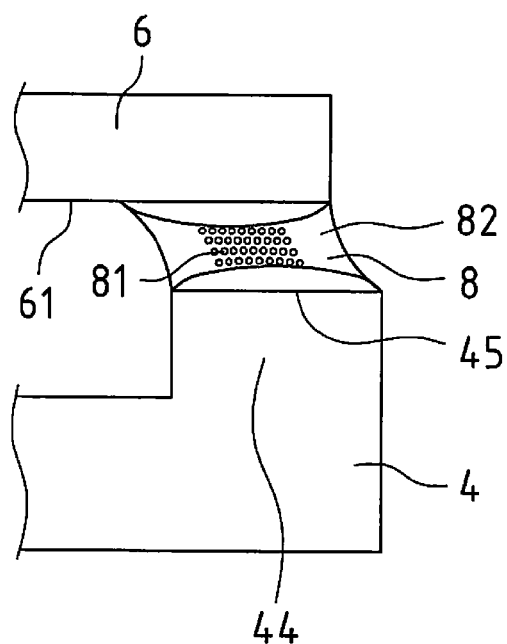
FIG. 15 is an enlarged side view corresponding to FIG. 5, illustrating how the base and the lid are connected according to another embodiment,.

Furthermore, the base 4 and the lid 6 according to the present embodiment have substantially the same dimensions in plan view (i.e., their main faces are of substantially the same dimensions), but the present invention is not limited to this, and the lid 6 may have smaller dimensions in plan view than the base 4. According to such an embodiment, the lid 6 is bonded, by heat melting, to the base 4 on which the crystal resonator plate 2 is mounted, via the base bonding layer 46 formed on the top face 45 of the base 4 and the lid bonding layer 62 formed on the bottom face of the lid 6. This produces the crystal resonator 1 in which the crystal resonator plate 2 is hermetically sealed. In this embodiment, since the lid 6 have smaller dimensions in plan view than the base 4, the base bonding layer 46 and the lid bonding layer 62 are pulled toward each other so as to be bound together. Accordingly, fillets are formed on two side faces of the bonding material 8 as shown in FIG. 15. Note that it is possible to eliminate the Sn 82 of the bonding material 8 located in the cavity 47 by controlling the amount of the Sn 82 in the bonding material 8 and the arrangement of the Sn within the base bonding layer 46 and the lid bonding layer 62.

The present invention can be reduced to practice in various other forms without departing from its spirit or essential features. For this reason, the above-described exemplary embodiments are to all intents and purposes merely illustrative and should not be construed as limiting. The scope of the present invention is defined by the claims and is not in any way restricted by the descriptions of the specification. Furthermore, all variations and modifications of the claims within the scope of equivalency fall within the scope of the present invention.

Also, this application claims prior right on the basis of Japanese Patent Application No. 2010-018751 filed in Japan on Jan. 29, 2010, the content of which is hereby incorporated in its entirety by reference herein.

INDUSTRIAL APPLICABILITY

The present invention is applicable to a piezoelectric resonator device.

DESCRIPTION OF REFERENCE NUMERALS

1 Crystal resonator
11 Internal space
2 Crystal resonator plate
21 Substrate
22, 23 Main face
24 Resonator portion
25 Bonding portion
31, 32 Excitation Electrode
33, 34 Terminal electrode
35, 36 Draw-out electrode
4 Base
41 Bottom portion
42, 43 Main face
44 Bank portion
45 Top face
46 Base bonding layer
47 Cavity
48 Castellation
49 Via
51, 52 Electrode pad
53, 54 External terminal electrode
55 Wiring pattern
56 Conducting member
6 Lid
61 Bottom face
62 Lid bonding layer
7 Conductive bump
8 Bonding material
81 Sn—Cu alloy
82 Sn
92 Crystal resonator plate
922, 923 Main face
926 Bank portion
927 Top face
928 Third bonding layer
94 One sealing member
946 First bonding layer
96 Other sealing member
962 Second bonding layer

The invention claimed is:

1. A piezoelectric resonator device in which excitation electrodes of a piezoelectric resonator plate are hermetically sealed,
   a plurality of sealing members that hermetically seal the excitation electrodes of the piezoelectric resonator plate,
   the plurality of sealing members each having a bonding layer, and
   at least one of the plurality of sealing members being provided with a bank portion and having the bonding layer formed on a top face of the bank portion,
   wherein the plurality of sealing members are bonded together with the bonding layers of the sealing members to form a bonding material containing an intermetallic compound,
   the bonding layers comprise a first bonding layer and a second bonding layer opposed to each other,
   the bonding material is sandwiched between the first bonding layer and the second bonding layer,
   the intermetallic compound is biasedly positioned within the bonding material in such a manner as to be continuously present from a first end face of the bonding material contacting the first bonding layer to a second end face of the bonding material contacting the second bonding layer,
   the bonding material further comprises a substance other than the intermetallic compound, and
   the other substance is provided to surround the intermetallic compound.

2. A piezoelectric resonator device in which excitation electrodes of a piezoelectric resonator plate are hermetically sealed, comprising:
   a plurality of sealing members that hermetically seal the excitation electrodes of the piezoelectric resonator plate,
   the piezoelectric resonator plate and the plurality of sealing members each having a bonding layer, and at least one of the piezoelectric resonator plate and the plurality of sealing members being provided with a bank portion and having the bonding layer formed on a top face of the bank portion, wherein the piezoelectric resonator plate and the plurality of sealing members are bonded to one another with the bonding layers of the piezoelectric resonator plate and the sealing members, and a bonding material that contains an intermetallic compound is formed, the bonding layers comprise a first bonding layer and a second bonding layer opposed to each other, the bonding material is sandwiched between the first bonding layer and the second bonding layer, the intermetallic compound is biasedly positioned within the bonding material in such a manner as to be continuously present from a first end face of the bonding material contacting the first bonding layer to a second end face of the bonding material contacting the second bonding layer, the bonding material further comprises a substance other than the intermetallic compound, and the other substance is provided to surround the intermetallic compound.

3. The piezoelectric resonator device according to claim 1, wherein at least one of the first and second surfaces of the first and second bonding layers contacting the bonding material, or at least one surface of the sealing members contacting the bonding layers, the bonding layers being formed on the sealing members, has a convex shape.

4. The piezoelectric resonator device according to claim 1, wherein at least one surface of the sealing members contacting the bonding layers, the bonding layers being formed on the sealing members, has a convex shape, and the at least one of the surfaces of the sealing members contacting the bonding layers and having the convex shape is made of the same material as that of the corresponding at least one of the sealing members.

5. The piezoelectric resonator device according to claim 1, wherein at least one of the sealing members has a flat bonding face where one of the bonding layers is formed, the bonding layer formed on the flat bonding face is formed along an outer periphery of the bonding face, and the bonding layers are bonded together along the top face of the bank portion and the outer periphery of the bonding face.

6. The piezoelectric resonator device according to claim 1, wherein the intermetallic compound is concentrated around a narrowest gap between the first end face and the second end face of the bonding material.

7. The piezoelectric resonator device according to claim 6, wherein the narrowest gap ranges from 3 to 20 μm.

8. The piezoelectric resonator device according to claim 1, wherein the bonding layers contain both Cu and Sn.

9. A piezoelectric resonator device in which excitation electrodes of a piezoelectric resonator plate are hermetically sealed, comprising:

a plurality of sealing members that hermetically seal the excitation electrodes of the piezoelectric resonator plate, the plurality of sealing members being bonded together with a bonding material that contains an intermetallic compound, wherein the plurality of sealing members comprise a first sealing member and a second sealing member opposed to each other, the intermetallic compound is biasedly positioned within the bonding material in such a manner as to be continuously present from a first end face of the bonding material facing the first sealing member to a second end face of the bonding material facing the second sealing member, the bonding material further comprises a substance other than the intermetallic compound, and the other substance is provided to surround the intermetallic compound.

10. A piezoelectric resonator device in which excitation electrodes of a piezoelectric resonator plate are hermetically sealed, comprising:

a plurality of sealing members that hermetically seal the excitation electrodes of the piezoelectric resonator plate, the piezoelectric resonator plate and the plurality of sealing members being bonded to one another with a bonding material that contains an intermetallic compound, wherein the intermetallic compound is biasedly positioned within the bonding material in such a manner as to be continuously present from a first end face of the bonding material facing the piezoelectric resonator plate to a second end face of the bonding material facing each of the sealing members, the bonding material further comprises a substance other than the intermetallic compound, and the other substance is provided to surround the intermetallic compound.

11. A manufacturing method for the piezoelectric resonator device according to claim 1, comprising:

forming the bonding layer having a Sn—Cu layer as an uppermost layer, on one of the plurality of sealing members; and forming the bonding layer having a Cu layer as an uppermost layer, on another one of the sealing members that is bonded to the one sealing member, the Cu layer having a smaller area than the Sn—Cu layer, wherein the Sn—Cu layer and the Cu layer are bonded to each other by heating, "surfaces of the first and second bonding layers contacting the bonding material.

12. The piezoelectric resonator device according to claim 2, wherein at least one of the surfaces of the first and second bonding layers contacting the bonding material, at least one surface of the sealing members contacting the bonding layers, the bonding layers being formed on the sealing members, or at least one surface of the piezoelectric resonator plate contacting the bonding layers, the bonding layers being formed on the piezoelectric resonator plate, has a convex shape.

13. The piezoelectric resonator device according to claim 2, wherein at least one of surfaces of the sealing members contacting the bonding layers, the bonding layers being formed on the sealing members, or at least one surface of the piezoelectric resonator plate contacting the bonding layer, the bonding layers being formed on the piezoelectric resonator plate, has a convex shape, and the at least one of the surfaces of the sealing members contacting the bonding layers and having the convex shape or the at least one of the surfaces of the piezoelectric resonator plate contacting the bonding layers and having the convex shape is made of the same material as that of the corresponding at least one of the sealing members and the piezoelectric resonator plate.

14. The piezoelectric resonator device according to claim 2, wherein at least one of the piezoelectric vibrating plate and the sealing members has a flat bonding face where one of the bonding layers is formed, the bonding layer formed on the flat bonding face is formed along an outer periphery of the bonding face, and the bonding layers are bonded together along the top face of the bank portion and the outer periphery of the bonding face.

15. The piezoelectric resonator device according to claim 2, wherein the intermetallic compound is concentrated around a narrowest gap between the first end face and the second end face of the bonding material.

16. The piezoelectric resonator device according to claim 15, wherein the narrowest gap ranges from 3 to 20 µm.

17. The piezoelectric resonator device according to claim 2, wherein the bonding layers contain both Cu and Sn.

18. The piezoelectric resonator device according to claim 1, wherein the intermetallic compound is a Cu—Sn intermetallic compound, and the other substance is Sn.

19. The piezoelectric resonator device according to claim 2, wherein the intermetallic compound is a Cu—Sn intermetallic compound, and the other substance is Sn.

* * * * *